(12) United States Patent
Zhang et al.

(10) Patent No.: US 10,839,764 B2
(45) Date of Patent: Nov. 17, 2020

(54) GOA CIRCUIT AND DISPLAY DEVICE

(71) Applicant: WUHAN CHINA STAR OPTOELECTRONICS TECHNOLOGY CO., LTD., Wuhan (CN)

(72) Inventors: Xin Zhang, Wuhan (CN); Juncheng Xiao, Wuhan (CN); Yanqing Guan, Wuhan (CN); Chao Tian, Wuhan (CN)

( * ) Notice: Subject to any disclaimer, the term of this patent is extended or adjusted under 35 U.S.C. 154(b) by 104 days.

(21) Appl. No.: 16/342,208

(22) PCT Filed: Sep. 26, 2018

(86) PCT No.: PCT/CN2018/107759
§ 371 (c)(1),
(2) Date: Apr. 16, 2019

(87) PCT Pub. No.: WO2020/019486
PCT Pub. Date: Jan. 30, 2020

(65) Prior Publication Data
US 2020/0035181 A1    Jan. 30, 2020

(30) Foreign Application Priority Data

Jul. 24, 2018 (CN) .......................... 2018 1 0822002

(51) Int. Cl.
*G11C 19/00* (2006.01)
*G09G 3/36* (2006.01)
(Continued)

(52) U.S. Cl.
CPC ............. *G09G 3/3677* (2013.01); *G09G 3/20* (2013.01); *G11C 19/28* (2013.01); *G11C 19/287* (2013.01);
(Continued)

(58) Field of Classification Search
None
See application file for complete search history.

(56) References Cited

U.S. PATENT DOCUMENTS

| 10,302,985 B1 * | 5/2019 | Gong | ........................ G09G 3/36 |
| 2015/0294734 A1 * | 10/2015 | Chan | ...................... G11C 19/28 |
| | | | 327/109 |

(Continued)

FOREIGN PATENT DOCUMENTS

| CN | 105590608 A | 5/2016 |
| CN | 107452312 A | 12/2017 |

(Continued)

*Primary Examiner* — Tuan T Lam

(57) ABSTRACT

A gate driver of array (GOA) circuit and a display device are disclosed. An n-th sub-circuit in the GOA circuit includes a control module, an output module, a pull-up supplement module, and a leakage switch. The control module is electrically connected to a positive scan control terminal, a negative scan control terminal, an (n−2)th scan terminal, an (n+2)th scan terminal, an (n+1)th clock terminal, an (n−1)th clock terminal, a high voltage terminal, and a low voltage terminal. The output module is electrically connected to the high voltage terminal, the low voltage terminal, an n-th clock terminal, an n-th scan terminal, and a controllable terminal. The pull-up supplement module includes a supplement switch that is electrically connected to the high voltage terminal, the control module, and the output module. The leakage switch is electrically connected to the control module, the output module, the supplement switch, and the low voltage terminal.

17 Claims, 2 Drawing Sheets

(51) Int. Cl.
 *G11C 19/28* (2006.01)
 *G09G 3/20* (2006.01)
 *G06F 3/041* (2006.01)

(52) U.S. Cl.
 CPC . *G06F 3/04166* (2019.05); *G09G 2310/0286* (2013.01); *G09G 2310/08* (2013.01); *G09G 2320/02* (2013.01); *G09G 2330/08* (2013.01)

(56) References Cited

U.S. PATENT DOCUMENTS

| | | | |
|---|---|---|---|
| 2016/0358564 A1* | 12/2016 | Xiao | G09G 3/20 |
| 2017/0123556 A1 | 5/2017 | Lin et al. | |
| 2017/0344179 A1 | 11/2017 | Kim et al. | |
| 2018/0047751 A1* | 2/2018 | Xiao | G09G 3/3659 |
| 2018/0068628 A1* | 3/2018 | Xiao | G09G 3/3648 |
| 2019/0130858 A1* | 5/2019 | Xiao | G09G 3/3677 |
| 2019/0163001 A1 | 5/2019 | Gong | |
| 2019/0180708 A1* | 6/2019 | Hong | G09G 3/3677 |
| 2019/0385555 A1* | 12/2019 | Guan | G09G 3/3677 |
| 2019/0385557 A1* | 12/2019 | Hong | G09G 3/3674 |
| 2020/0082764 A1* | 3/2020 | Lee | G09G 3/3233 |
| 2020/0090609 A1* | 3/2020 | Guan | G09G 3/3674 |

FOREIGN PATENT DOCUMENTS

| | | |
|---|---|---|
| CN | 107749281 A | 3/2018 |
| CN | 108010498 A | 5/2018 |
| CN | 108091308 A | 5/2018 |
| KR | 20180039196 | 4/2018 |

\* cited by examiner

GOA CIRCUIT AND DISPLAY DEVICE

FIELD OF INVENTION

The present disclosure relates to the technical field of displays, and specifically to a gate driver on array (GOA) circuit and a display device, which may be used for liquid crystal display.

BACKGROUND OF INVENTION

Currently, liquid crystal display (LCD) has been widely used in various electronic products. An important component in the liquid crystal display is a gate driver on array (GOA) circuit. The GOA circuit mainly uses a gate-row-scanned driving circuit that is fabricated on an array substrate using an array process of a thin film transistor (TFT) liquid crystal display, to realize progressive scan of a gate of each of pixel transistors.

In technology of display panels, low temperature poly-silicon (LTPS) based technology is divided into types of NMOS, PMOS, and CMOS including NMOS and PMOS, according to type of thin field transistors used in the panels. Similarly, the GOA circuit is also divided into circuits of NMOS, PMOS, and CMOS. Compared with the CMOS circuit, P-type doped photomask and the process may be eliminated in the NMOS circuit. That is helpful for improving yield and reducing a cost, so development of a stable NMOS circuit has industrial demand.

However, since carriers of the NMOS type TFT are electrons, and mobility of electrons is higher than that of holes. Therefore, the NMOS device is more susceptible to damage than the PMOS device (carriers thereof are holes). The performance of the panel is insufficient to the high temperature reliability of the product, and the GOA circuit is easily to failure, causing the panel to appear split-screen phenomenon. Especially, for in-cell touch panel (ITP), the split-screen phenomenon occurs more likely in a pause stage for the touch panel (TP). Because TFT is not an ideal switching device, even if in a case of an off state, there will still be a certain leakage current. If the pause stage for the TP needs to maintain a high voltage for a long time, which will reduce stability of the GOA. In the past, although the GOA circuit has blocked an electrical leakage path to try to solve the above problems, it still needed to be improved.

Thus, a GOA circuit and a display device are urgently needed to solve above problems.

SUMMARY OF INVENTION

An object of the present disclosure is to provide a gate driver on array (GOA) circuit that avoids leakage current of transistors causing failure of the GOA circuit, to improve stability of transmission between cascaded sub-circuits.

Another object of the present disclosure is to provide a display device that is able to improve stability of transmission between cascaded sub-circuits, to improve reliability of products.

In order to solve problems, the technical solution by the present disclosure is as follows.

In order to achieve the above object of the present disclosure, an aspect of the present disclosure provides a GOA circuit, which includes a plurality of cascaded sub-circuits, wherein an n-th sub-circuit of the sub-circuits includes: a control module electrically connected to a positive scan control terminal, a negative scan control terminal, an (n−2)th scan terminal, an (n+2)th scan terminal, an (n+1)th clock terminal, an (n−1)th clock terminal, a high voltage terminal, and a low voltage terminal;

an output module electrically connected to the high voltage terminal, the low voltage terminal, an n-th clock terminal, an n-th scan terminal, and a controllable terminal;

a pull-up supplement module comprising a supplement switch that is electrically connected to the high voltage terminal, the control module, and the output module; and a leakage switch electrically connected to the control module, the output module, the supplement switch, and the low voltage terminal;

wherein the control module comprises a first switch, a second switch, a third switch, a fourth switch, a fifth switch, and a sixth switch; wherein the first switch is electrically connected to the (n−2)th scan terminal, the positive scan control terminal, the second switch, the sixth switch, the supplement switch, and the output module; wherein the second switch is electrically connected to the (n+2)th scan terminal, the negative scan control terminal, the first switch, the sixth switch, the supplement switch, and the output module; wherein the third switch is electrically connected to the positive scan control terminal, the (n+1)th clock terminal, the fourth switch, and the fifth switch; wherein the fourth switch is electrically connected to the negative scan control terminal, the (n−1)th clock terminal, the third switch, and the fifth switch; wherein the fifth switch is electrically connected to the high voltage terminal, the third switch, the fourth switch, the sixth switch, the leakage switch, and the output module; and wherein the sixth switch is electrically connected to the low voltage terminal, the first switch, the second switch, the fifth switch, the supplement switch, the output module, and the leakage switch; and wherein the output module comprises a relay unit, a pull-up unit, a pull-down unit, a detection unit, a first energy storing element, and a second energy storing element; wherein the relay unit is electrically connected to the high voltage terminal, the supplement switch, the control module, and the pull-up unit wherein the relay unit, the supplement switch, and the control module are commonly connected to form a first node; wherein the pull-up unit is electrically connected to the relay unit, the n-th clock terminal, and the n-th scan terminal; wherein the pull-down unit is electrically connected to the n-th scan terminal, the low voltage terminal, the leakage switch, and the control module; wherein the detection unit is electrically connected to the n-th scan terminal, the low voltage terminal, the controllable terminal, the pull-down unit, the leakage switch, and the control module; wherein the pull-down unit, the detection unit, the leakage switch, and the control module are commonly connected to a second node; wherein the first energy storing element is electrically connected between the first node and the low voltage terminal; and wherein the second energy storing element is electrically connected between the second node and the low voltage terminal.

In an embodiment of the present disclosure, a control end of the supplement switch is electrically connected to a second end of the supplement switch, the control module, the output module, and the leakage switch; and a first end of the supplement switch is electrically the high voltage terminal.

In an embodiment of the present disclosure, a control end of the leakage switch is electrically connected to the control module and the output module; a first end of the leakage switch is electrically connected to the control end the supplement switch and the second end of the supplement switch; and a second end of the leakage switch is electrically connected to the low voltage terminal.

In an embodiment of the present disclosure, the relay unit includes a seventh switch; a control end of the seventh switch is electrically connected to the high voltage terminal; a first end of the seventh switch is electrically connected to the first node; and a second end of the seventh switch is electrically connected to the pull-up unit.

In an embodiment of the present disclosure, the pull-up unit includes an eighth switch; a control end of the eighth switch is electrically connected to the relay unit; a first end of the eighth switch is electrically connected to the n-th clock terminal; and a second end of the eighth switch is electrically connected to the n-th scan terminal.

In an embodiment of the present disclosure, the pull-down unit includes a ninth switch; a control end of the ninth switch is electrically connected to the second node; a first end of the ninth switch is electrically connected to the n-th scan terminal; and a second end of the ninth switch is electrically connected to the low voltage terminal.

In an embodiment of the present disclosure, the detection unit includes a tenth switch, an eleventh switch, and a twelfth switch; a control end of the tenth switch is electrically connected to a first end of the tenth switch and a control end of the eleventh switch; a second end of the tenth switch is electrically connected to the n-th scan terminal; a first end of the eleventh switch is electrically connected to the second node; a second end of the eleventh switch is electrically connected to the low voltage terminal; a control end of the twelfth switch is electrically connected to the controllable terminal; a first end of the twelfth switch is electrically connected to the n-th scan terminal; and a second end of the twelfth switch is electrically connected to the low voltage terminal.

In order to achieve the above object of the present disclosure, another aspect of the present disclosure provides a GOA circuit, which includes a plurality of cascaded sub-circuits, wherein an n-th sub-circuit of the sub-circuits includes: a control module electrically connected to a positive scan control terminal, a negative scan control terminal, an (n−2)th scan terminal, an (n+2)th scan terminal, an (n+1)th clock terminal, an (n−1)th clock terminal, a high voltage terminal, and a low voltage terminal; an output module electrically connected to the high voltage terminal, the low voltage terminal, an n-th clock terminal, an n-th scan terminal, and a controllable terminal; a pull-up supplement module comprising a supplement switch that is electrically connected to the high voltage terminal, the control module, and the output module; and a leakage switch electrically connected to the control module, the output module, the supplement switch, and the low voltage terminal.

In an embodiment of the present disclosure, a control end of the supplement switch is electrically connected to a second end of the supplement switch, the control module, the output module, and the leakage switch; and a first end of the supplement switch is electrically the high voltage terminal.

In an embodiment of the present disclosure, a control end of the leakage switch is electrically connected to the control module and the output module; a first end of the leakage switch is electrically connected to the control end the supplement switch and the second end of the supplement switch; and a second end of the leakage switch is electrically connected to the low voltage terminal.

In an embodiment of the present disclosure, the control module comprises a first switch, a second switch, a third switch, a fourth switch, a fifth switch, and a sixth switch; the first switch is electrically connected to the (n−2)th scan terminal, the positive scan control terminal, the second switch, the sixth switch, the supplement switch, and the output module; the second switch is electrically connected to the (n+2)th scan terminal, the negative scan control terminal, the first switch, the sixth switch, the supplement switch, and the output module; the third switch is electrically connected to the positive scan control terminal, the (n+1)th clock terminal, the fourth switch, and the fifth switch; the fourth switch is electrically connected to the negative scan control terminal, the (n−1)th clock terminal, the third switch, and the fifth switch; the fifth switch is electrically connected to the high voltage terminal, the third switch, the fourth switch, the sixth switch, the leakage switch, and the output module; and the sixth switch is electrically connected to the low voltage terminal, the first switch, the second switch, the fifth switch, the supplement switch, the output module, and the leakage switch.

In an embodiment of the present disclosure, the output module comprises a relay unit, a pull-up unit, a pull-down unit, a detection unit, a first energy storing element, and a second energy storing element; the relay unit is electrically connected to the high voltage terminal, the supplement switch, the control module, and the pull-up unit; the relay unit, the supplement switch, and the control module are commonly connected to form a first node; the pull-up unit is electrically connected to the relay unit, the n-th clock terminal, and the n-th scan terminal; the pull-down unit is electrically connected to the n-th scan terminal, the low voltage terminal, the leakage switch, and the control module; the detection unit is electrically connected to the n-th scan terminal, the low voltage terminal, the controllable terminal, the pull-down unit, the leakage switch, and the control module; the pull-down unit, the detection unit, the leakage switch, and the control module are commonly connected to a second node; the first energy storing element is electrically connected between the first node and the low voltage terminal; and the second energy storing element is electrically connected between the second node and the low voltage terminal.

In an embodiment of the present disclosure, the relay unit comprises a seventh switch; a control end of the seventh switch is electrically connected to the high voltage terminal; a first end of the seventh switch is electrically connected to the first node; and a second end of the seventh switch is electrically connected to the pull-up unit.

In an embodiment of the present disclosure, the pull-up unit comprises an eighth switch; a control end of the eighth switch is electrically connected to the relay unit; a first end of the eighth switch is electrically connected to the n-th clock terminal; and a second end of the eighth switch is electrically connected to the n-th scan terminal.

In an embodiment of the present disclosure, the pull-down unit comprises a ninth switch; a control end of the ninth switch is electrically connected to the second node; a first end of the ninth switch is electrically connected to the n-th scan terminal; and a second end of the ninth switch is electrically connected to the low voltage terminal.

In an embodiment of the present disclosure, the detection unit comprises a tenth switch, an eleventh switch, and a twelfth switch; a control end of the tenth switch is electrically connected to a first end of the tenth switch and a control end of the eleventh switch; a second end of the tenth switch is electrically connected to the n-th scan terminal; a first end of the eleventh switch is electrically connected to the second node; a second end of the eleventh switch is electrically connected to the low voltage terminal; a control end of the twelfth switch is electrically connected to the controllable terminal; a first end of the twelfth switch is electrically connected to the n-th scan terminal; and a second end of the twelfth switch is electrically connected to the low voltage terminal.

In order to achieve the above object of the present disclosure, another aspect of the present disclosure provides a display device, which includes an array substrate and a GOA circuit as described above, wherein the GOA circuit is disposed on the array substrate.

Beneficial effects of the present disclosure are described as follows. Compared with the prior art, the GOA circuit and the display device of the present disclosure are provided with the pull-up supplement module. If the leakage switch has a certain leakage current during the touch period to cause voltage at the first node being decreased. At the same time, because the supplemental switch of the pull-up supplemental module also has a certain leakage current to increase the voltage at the first node, thereby relieving influence of leakage current of the leakage switch to the voltage at the first node. Therefore, control margin of the circuit during a touch period is increased, so that the circuit operates normally and reliability of the circuit is improved.

BRIEF DESCRIPTION OF DRAWINGS

In order to more clearly illustrate technical solutions in the present embodiments or the prior art, drawings used in a description of the embodiments or the prior art will be briefly described below. Obviously, the drawings in the following description are merely some embodiments of the present disclosure, and other drawings may be obtained from those skilled in the art without any creative work.

DETAILED DESCRIPTION OF PREFERRED EMBODIMENTS

Figure 1:
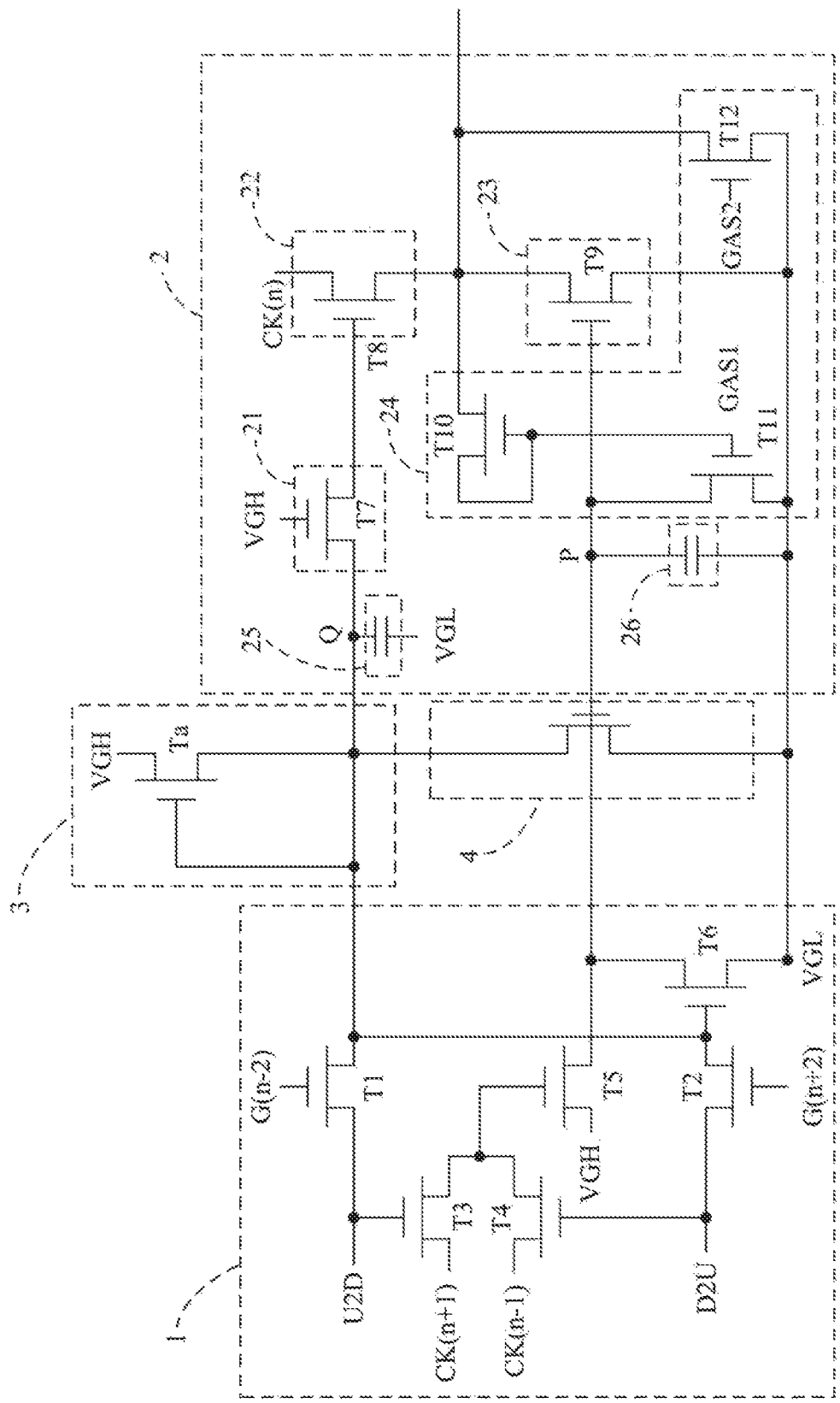
FIG. 1 is a schematic diagram of a gate driver on array (GOA) circuit according to an embodiment of the present disclosure.

The following description of each embodiment refers to the appended drawings for illustrating specific embodiments in which the present disclosure may be practiced. Directional terms as mentioned in the present disclosure, such as "up", "down", "front", "rear", "left", "right", "inside", "outside", "lateral", etc., are merely used for the purpose of illustrating and understanding the present disclosure and are not intended to be limiting of the present disclosure. In the drawings, units with similar structures are denoted by the same reference numerals.

Please refer to FIG. 1, an aspect of the present disclosure includes a gate driver on array (GOA) circuit, which is able to be used for controlling a display panel based on low temperature poly-silicon (LTPS) technology. A type of thin film transistor (TFT) adopted in the display panel may be NMOS transistor. The switch described later may have a control end (such as a gate of the transistor), a first end (such as one of a source and a drain of the transistor), and a second end (such as the other of the source and the drain of the transistor).

Please refer to FIG. 1, the GOA circuit may include a plurality of cascaded sub-circuits. Hereafter, only an n-th sub-circuit is taken as an example. For example, n may be a positive integer representing one of the cascaded sub-circuits, and the remaining sub-circuits are the same as the n-th sub-circuit. It can be understood by those skilled in the art, and will not be described here. The n-th sub-circuit of the cascaded sub-circuits may include: a control module 1, an output module 2, a pull-up supplement module 3, and a leakage switch 4. An embodied example of the GOA circuit according to one embodiment of the present disclosure is illustrated below, but is not limited as described here.

Please refer to FIG. 1, the control module 1 may be electrically connected to a positive scan control terminal U2D, a negative scan control terminal D2U, an (n−2)th scan terminal G(n−2), an (n+2)th scan terminal G(n+2), an (n+1)th clock terminal CK(n+1), an (n−1)th clock terminal CK(n−1), a high voltage terminal VGH, and a low voltage terminal VGL. The output module 2 may be electrically connected to the high voltage terminal VGH, the low voltage terminal VGL, an n-th clock terminal CK(n), an n-th scan terminal G(n), and a controllable terminal GAS2. The pull-up supplement module 3 may include a supplement switch Ta that is electrically connected to the high voltage terminal VGH, the control module 1, and the output module 2. The leakage switch 4 may be electrically connected to the control module 1, the output module 2, the supplement switch Ta, and the low voltage terminal VGL.

It should be understood that, the positive scan control terminal U2D and the negative scan control terminal D2U may be used to input signals to control progressive scan order. For example, if a constant high voltage signal is input to the positive scan control terminal U2D and a constant low voltage signal is input to the negative scan control terminal D2U, the progressive scan order is from top to bottom. Alternatively, if the constant low voltage signal is input to the positive scan control terminal U2D and the constant high voltage signal is input to the negative scan control terminal D2U, the progressive scan order is from bottom to top.

In addition, the (n−2)th scan terminal G(n−2) and the (n+2)th scan terminal G(n+2) may be used to input signals output from scan terminals of the the (n−2)th sub-circuit and the (n+2)th sub-circuit. The (n+1)th clock terminal CK(n+1), the n-th clock terminal CK(n), and (n−1)th clock terminal CK(n−1) may input clock signals that are used for the (n+1)th sub-circuit, the n-th sub-circuit, and the (n−1) sub-circuit. The n-th scan terminal G(n) may be used to output an n-th scan signal that is used to progressively scan gates the pixel transistors. The high voltage terminal VGH and the low voltage terminal VGL may be used to input a high voltage signal and a low voltage signal in which voltage can by adjusted with the transistor. The controllable terminal GAS2 may be used to a control signal, such as a pulse signal, that is used to cooperate with a state of touch panel term holding (TP term holding), for example, the controllable signal is high voltage within a TP term and is low voltage within the other term, which is understandable to those skilled in the art and is not be described here.

In an embodiment, as shown in FIG. 1, the control module 1 may include a first switch T1, a second switch T2, a third switch T3, a fourth switch T4, a fifth switch T5, and a sixth switch T6.

The control end of the first switch T1 is electrically connected to the (n−2)th scan terminal G(n−2). The first end of the first switch T1 is electrically connected to the positive scan control terminal U2D. The second end of the first switch T1 is electrically connected to the second end of the second switch T2, the control end of the sixth switch T6, the control end of the supplement switch Ta, the second end of the supplement switch Ta, and the output module 2.

The control end of the second switch T2 is electrically connected to the (n+2)th scan terminal G(n+2). The first end of the second switch T2 is electrically connected to the negative scan control terminal D2U. The second end of the second switch T2 is electrically connected to the second end of the first switch T1, the control end of the sixth switch T6, the control end of the supplement switch Ta, the second end of the supplement switch Ta, and the output module 2.

The control end of the third switch T3 is electrically connected to the positive scan control terminal U2D. The first end of the third switch T3 is electrically connected to the (n+1)th clock terminal CK(n+1). The second end of the third switch T3 is electrically connected to the second end of the fourth switch T4 and the control end of the fifth switch T5.

The control end of the fourth switch T4 is electrically connected to the negative scan control terminal D2U. The first end of the fourth switch T4 is electrically connected to the (n−1)th clock terminal CK(n−1). The second end of the fourth switch T4 is electrically connected to the second end of the third switch T3 and the control end of the fifth switch T5.

The control end of the fifth switch T5 is electrically connected to the second end of the third switch T3 and the second end of the fourth switch T4. The first end of the fifth switch T5 is electrically connected to the high voltage terminal. The second end of the fifth switch T5 is electrically connected to the first end of the sixth switch T6, the control end of the leakage switch 4, and the output module 2.

The control end of the sixth switch T6 is electrically connected to the second end of the first switch T1, the second end of the second switch T2, the control end of the supplement switch Ta, the second end of the supplement switch Ta, and the output module 2. The first end of the sixth switch T6 is electrically connected to the second end of the fifth switch, the output module 2 and the control end of the leakage switch 4. The second end of the sixth switch T6 is electrically connected to the low voltage terminal.

In an embodiment, as shown in FIG. 1, the output module may include a relay unit 21, a pull-up unit 22, a pull-down unit 23, a detection unit 24, a first energy storing element 25, and a second energy storing element 26.

The relay unit 21 is electrically connected to the high voltage terminal VGH, the supplement switch Ta, the control module 1, and the pull-up unit 22. The relay unit 21, the supplement switch Ta, and the first switch T1 of the control module 1 are commonly connected to form a first node Q. The pull-up unit 22 is electrically connected to the relay unit 21, the n-th clock terminal CK(n), and the n-th scan terminal G(n). The pull-down unit 23 is electrically connected to the n-th scan terminal G(n), the low voltage terminal VGL, the leakage switch 4, and the control module 4. The detection unit 24 is electrically connected to the n-th scan terminal G(n), the low voltage terminal VGL, the controllable terminal GAS2, the pull-down unit 23, the leakage switch 24, and the control module 1. The pull-down unit 23, the detection unit 24, the leakage switch 4, and the control module 1 are commonly connected to a second node Q. The first energy storing element 25 (e.g. capacitor) is electrically connected between the first node Q and the low voltage terminal VGL; and the second energy storing element 26 (e.g. capacitor) is electrically connected between the second node P and the low voltage terminal VGL.

Specifically, as shown in FIG. 1, the relay unit 21 includes a seventh switch T7. The control end of the seventh switch T7 is electrically connected to the high voltage terminal VGH. The first end of the seventh switch T7 is electrically connected to the first node Q. The second end of the seventh switch T7 is electrically connected to the pull-up unit 22.

Specifically, as shown in FIG. 1, the pull-up unit 22 includes an eighth switch T8. The control end of the eighth switch T8 is electrically connected to the relay unit 21. The first end of the eighth switch T8 is electrically connected to the n-th clock terminal CK(n). The second end of the eighth switch T8 is electrically connected to the n-th scan terminal G(n).

Specifically, as shown in FIG. 1, the pull-down unit 23 includes a ninth switch T9. The control end of the ninth switch T9 is electrically connected to the second node P. The first end of the ninth switch T9 is electrically connected to the n-th scan terminal G(n). The second end of the ninth switch T9 is electrically connected to the low voltage terminal VGL.

Specifically, as shown in FIG. 1, the detection unit 24 includes a tenth switch T10, an eleventh switch T11, and a twelfth switch T12. The control end of the tenth switch T10 is electrically connected to the first end of the tenth switch T10 and the control end of the eleventh switch T11. The second end of the tenth switch T10 is electrically connected to the n-th scan terminal G(n). The first end of the eleventh switch T11 is electrically connected to the second node P. The second end of the eleventh switch T11 is electrically connected to the low voltage terminal VGL. The control end of the twelfth switch T12 is electrically connected to the controllable terminal GAS2. The first end of the twelfth switch T12 is electrically connected to the n-th scan terminal G(n). The second end of the twelfth switch T12 is electrically connected to the low voltage terminal VGL.

In some embodiment, as shown in FIG. 1, the control end of the supplement switch Ta of the pull-up supplement module 3 is electrically connected to the second end of the supplement switch Ta, the first transistor T1 of the control module 1, the relay unit 21 of the output module 2, and the first end of the leakage switch 4. The first end of the supplement switch Ta is electrically connected to the high voltage terminal VGH.

Furthermore, the control end of the leakage switch 4 is electrically connected to the fifth transistor T5, the sixth transistor T6 of the control module 1, and the pull-down unit 23 of the output module 2. The first end of the leakage switch 4 is electrically connected to the control end the supplement switch Ta and the second end of the supplement switch Ta. The second end of the leakage switch 4 is electrically connected to the low voltage terminal VGL.

The following description is an example of the operation of the above-mentioned GOA circuit. Taking the panel of in-cell touch panel (ITP) as an example, it is necessary to insert a plurality of touch panel terms (TP Term) within displaying time over a single frame. Within the displaying time, progressively scan order is controlled by signals input from the positive scan control terminal U2D and the negative scan control terminal D2U to cooperate with signals input via the (n−2)th scan terminal G(n−2) and the (n+2)th scan terminal G(n+2), the (n+1)th clock terminal CK(n+1), the n-th clock terminal CK(n), the (n−1)th clock terminal CK(n−1), the controllable terminal GAS2, the high voltage terminal VGH, and the low voltage terminal VGL. Thus, the n-th scan signal can be output via the n-th scan terminal G(n) for progressive scan.

Within the touch panel term, the first node Q can maintain voltage that is required for operating the circuit, to ensure normal operation. The features of the GOA circuit provided with the pull-up supplement module 3 are specifically described as follows.

Figure 2:
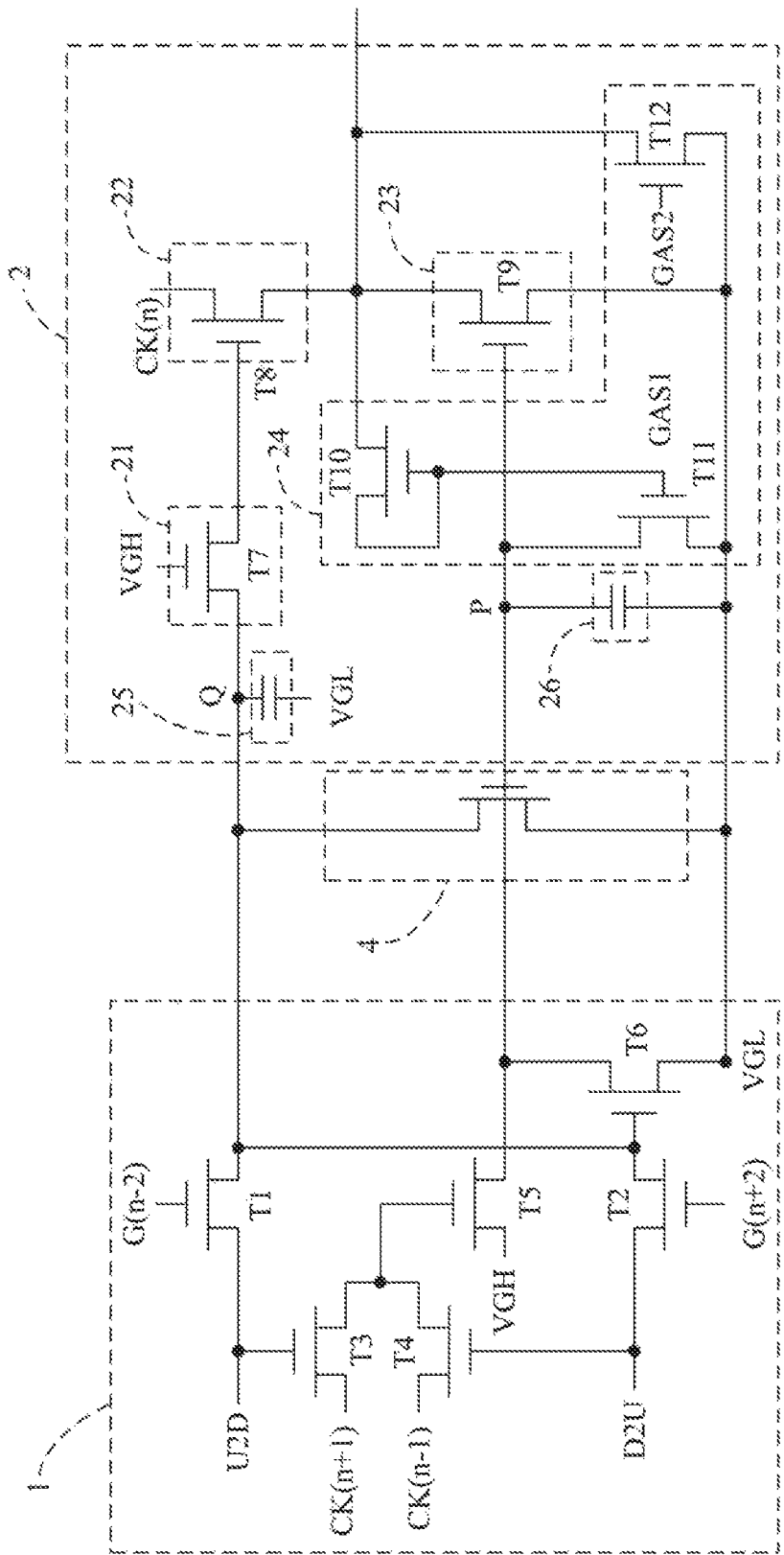
FIG. 2 is a schematic diagram of the GOA circuit which has not been provided with a pull-up supplement module.

First, to observe the GOA circuit that does not have the pull-up supplement module (as shown in FIG. 2), wherein the signal GAS1 (which is at the gate of the eleventh switch T11) is in a state of a constant low voltage under normal operation. Within the touch control term, voltage at the controllable terminal GAS2 is translated from the constant low voltage (Low) in a normal display state to a high voltage (High). Generally, the current panel type of ITP needs that several touch panel (TP) terms are inserted within displaying time over a single frame, to achieve touch function. Meanwhile, an NMOS type GOA circuit must hold the high voltage for requirement of cascaded transmission by the first energy storing element 25. However, the NMOS TFT is not an ideal switch. Even if the NMOS TFT is in a case of an off state, there will still be a certain leakage current. If the pause stage for the TP needs to maintain a high voltage for a long time, which will reduce stability of the GOA.

On the other hand, after the above-described pull-up supplement module 3 is set in the GOA circuit, the first end of the leakage switch 4 is electrically connected to the control end and the second end of the supplement switch Ta. When the first node Q is in high voltage of the cascaded holding state, in particular to in the holding state of the TP term, the leakage switch 4 is turned off and have a certain leakage current (from the first node Q to the low voltage terminal VGL), that decreases the voltage at the first node Q. However, it should be noted that, at the same time, the supplementary switch Ta is also in an off state, and there is also a certain leakage current (from the high voltage terminal VGH to the first node Q), that increases the voltage at the first node Q, thereby relieving influence of leakage current of the leakage switch to the voltage at the first node. Therefore, control margin of the circuit during a touch period is increased, so that the circuit operates normally and reliability of the circuit is improved.

It should be noted that, although the leakage current of the leakage switch 4 still reduces the voltage at the first node Q, an electrical leakage path of the leakage switch 4 according to the present disclosure is not cut off, that is different from and the GOA circuit in the prior art that cuts off the electrical leakage path. Instead, the pull-up supplement module 3 instantaneously supplies electrical power to the first energy storing element 25 with the leakage current characteristic of the supplement switch Ta, thereby relieving influence of leakage current of the leakage switch 4. Further, the voltage at the first node Q is maintained roughly to ensure that the circuit operates normally, and the panel of the display device is prevented from split-screen phenomenon.

It should be understood that, the driving architecture of the above GOA circuit can be interlaced or double-driven. A phase topology of 4CK, 6CK or 8CK may be used in the GOA circuit. Take the 4CK as an example, two GOA circuits are taken as one cycle. Two identical GOA circuits can be used as a first GOA circuit and a second GOA circuit, and four clock signals (i.e. CK1, CK2, CK3, CK4) are input to the first GOA circuit and the second GOA circuit. For example, as shown in FIG. 1 and FIG. 2, the signal CK1 may be input to the n-th clock terminal CK(n) of the first GOA circuit, the signals CK2 and the CK4 are input to the (n+1)th clock terminal CK(n+1) and the (n−1)th clock terminal of the first GOA circuit and the second GOA circuit, and the signal CK3 is input the n-th clock terminal CK(n) of the second GOA circuit. It can be understood by those skilled in the art, and will not be described here.

Another aspect of the present disclosure provides a display device, which includes an array substrate and the GOA circuit as above described, wherein the GOA circuit is disposed on the array substrate. The display device may be configured to one of devices as follows: any product or component having a display function, such as a liquid crystal panel, an electronic paper, an OLED panel, a mobile phone, a tablet computer, a television, a display, a notebook computer, a digital camera, a navigator, etc., the display device can solve the same problem and produce the same effect as the above GOA circuit.

In summary, although the present disclosure has been disclosed in the preferred embodiments, the above preferred embodiments are not intended to limit the present disclosure. Those skilled in the art may make various changes and modifications without departing from the spirit and scope of the present disclosure. Therefore, the protection scope of the present disclosure is based on the scope defined by the claims.

What is claimed is:

1. A gate driver on array (GOA) circuit, comprising a plurality of cascaded sub-circuits, wherein an n-th sub-circuit of the sub-circuits comprises:

a control module electrically connected to a positive scan control terminal, a negative scan control terminal, an (n−2)th scan terminal, an (n+2)th scan terminal, an (n+1)th clock terminal, an (n−1)th clock terminal, a high voltage terminal, and a low voltage terminal;

an output module electrically connected to the high voltage terminal, the low voltage terminal, an n-th clock terminal, an n-th scan terminal, and a controllable terminal;

a pull-up supplement module comprising a supplement switch that is electrically connected to the high voltage terminal, the control module, and the output module; and a leakage switch electrically connected to the control module, the output module, the supplement switch, and the low voltage terminal;

wherein the control module comprises a first switch, a second switch, a third switch, a fourth switch, a fifth switch, and a sixth switch; wherein the first switch is electrically connected to the (n−2)th scan terminal, the positive scan control terminal, the second switch, the sixth switch, the supplement switch, and the output module; wherein the second switch is electrically connected to the (n+2)th scan terminal, the negative scan control terminal, the first switch, the sixth switch, the supplement switch, and the output module; wherein the third switch is electrically connected to the positive scan control terminal, the (n+1)th clock terminal, the fourth switch, and the fifth switch; wherein the fourth switch is electrically connected to the negative scan control terminal, the (n−1)th clock terminal, the third switch, and the fifth switch; wherein the fifth switch is electrically connected to the high voltage terminal, the third switch, the fourth switch, the sixth switch, the leakage switch, and the output module; and wherein the sixth switch is electrically connected to the low voltage terminal, the first switch, the second switch, the fifth switch, the supplement switch, the output module, and the leakage switch; and wherein the output module comprises a relay unit, a pull-up unit, a pull-down unit, a detection unit, a first energy storing element, and a second energy storing element wherein the relay unit is electrically connected to the high voltage terminal, the supplement switch, the control module, and the pull-up unit wherein the relay unit, the supplement switch, and the control module are commonly connected to form a first node; wherein the pull-up unit is electrically connected to the relay unit, the n-th clock terminal, and the n-th scan terminal; wherein the pull-down unit is electrically connected to the n-th scan terminal, the low voltage terminal, the leakage switch, and the control module; wherein the detection unit is electrically connected to the n-th scan terminal, the low voltage terminal, the controllable terminal, the pull-down unit, the leakage switch, and the control module; wherein the pull-down unit, the detection unit, the leakage switch, and the control module are commonly connected to a second node; wherein the first energy storing element is electrically connected between the first node and the low voltage terminal; and wherein the second energy storing element is electrically connected between the second node and the low voltage terminal.

2. The GOA circuit as claimed in claim 1, wherein a control end of the supplement switch is electrically connected to a second end of the supplement switch, the control module, the output module, and the leakage switch; and a first end of the supplement switch is electrically the high voltage terminal.

3. The GOA circuit as claimed in claim 2, wherein a control end of the leakage switch is electrically connected to the control module and the output module; a first end of the leakage switch is electrically connected to the control end the supplement switch and the second end of the supplement switch; and a second end of the leakage switch is electrically connected to the low voltage terminal.

4. The GOA circuit as claimed in claim 1, wherein the relay unit comprises a seventh switch; a control end of the seventh switch is electrically connected to the high voltage terminal; a first end of the seventh switch is electrically connected to the first node; and a second end of the seventh switch is electrically connected to the pull-up unit.

5. The GOA circuit as claimed in claim 1, wherein the pull-up unit comprises an eighth switch; a control end of the eighth switch is electrically connected to the relay unit; a first end of the eighth switch is electrically connected to the n-th clock terminal; and a second end of the eighth switch is electrically connected to the n-th scan terminal.

6. The GOA circuit as claimed in claim 1, wherein the pull-down unit comprises a ninth switch; a control end of the ninth switch is electrically connected to the second node; a first end of the ninth switch is electrically connected to the n-th scan terminal; and a second end of the ninth switch is electrically connected to the low voltage terminal.

7. The GOA circuit as claimed in claim 1, wherein the detection unit comprises a tenth switch, an eleventh switch, and a twelfth switch; a control end of the tenth switch is electrically connected to a first end of the tenth switch and a control end of the eleventh switch; a second end of the tenth switch is electrically connected to the n-th scan terminal; a first end of the eleventh switch is electrically connected to the second node; a second end of the eleventh switch is electrically connected to the low voltage terminal; a control end of the twelfth switch is electrically connected to the controllable terminal; a first end of the twelfth switch is electrically connected to the n-th scan terminal; and a second end of the twelfth switch is electrically connected to the low voltage terminal.

8. A gate driver on array (GOA) circuit, comprising a plurality of cascaded sub-circuits, wherein an n-th sub-circuit of the sub-circuits comprises:
a control module electrically connected to a positive scan control terminal, a negative scan control terminal, an (n−2)th scan terminal, an (n+2)th scan terminal, an (n+1)th clock terminal, an (n−1)th clock terminal, a high voltage terminal, and a low voltage terminal;
an output module electrically connected to the high voltage terminal, the low voltage terminal, an n-th clock terminal, an n-th scan terminal, and a controllable terminal;
a pull-up supplement module comprising a supplement switch that is electrically connected to the high voltage terminal, the control module, and the output module; and
a leakage switch electrically connected to the control module, the output module, the supplement switch, and the low voltage terminal.

9. The GOA circuit as claimed in claim 8, wherein a control end of the supplement switch is electrically connected to a second end of the supplement switch, the control module, the output module, and the leakage switch; and a first end of the supplement switch is electrically the high voltage terminal.

10. The GOA circuit as claimed in claim 9, wherein a control end of the leakage switch is electrically connected to the control module and the output module; a first end of the leakage switch is electrically connected to the control end the supplement switch and the second end of the supplement switch; and a second end of the leakage switch is electrically connected to the low voltage terminal.

11. The GOA circuit as claimed in claim 8, wherein the control module comprises a first switch, a second switch, a third switch, a fourth switch, a fifth switch, and a sixth switch; the first switch is electrically connected to the (n−2)th scan terminal, the positive scan control terminal, the second switch, the sixth switch, the supplement switch, and the output module; the second switch is electrically connected to the (n+2)th scan terminal, the negative scan control terminal, the first switch, the sixth switch, the supplement switch, and the output module; the third switch is electrically connected to the positive scan control terminal, the (n+1)th clock terminal, the fourth switch, and the fifth switch; the fourth switch is electrically connected to the negative scan control terminal, the (n−1)th clock terminal, the third switch, and the fifth switch; the fifth switch is electrically connected to the high voltage terminal, the third switch, the fourth switch, the sixth switch, the leakage switch, and the output module; and the sixth switch is electrically connected to the low voltage terminal, the first switch, the second switch, the fifth switch, the supplement switch, the output module, and the leakage switch.

12. The GOA circuit as claimed in claim 8, wherein the output module comprises a relay unit, a pull-up unit, a pull-down unit, a detection unit, a first energy storing element, and a second energy storing element; the relay unit is electrically connected to the high voltage terminal, the supplement switch, the control module, and the pull-up unit; the relay unit, the supplement switch, and the control module are commonly connected to form a first node; the pull-up unit is electrically connected to the relay unit, the n-th clock terminal, and the n-th scan terminal; the pull-down unit is electrically connected to the n-th scan terminal, the low voltage terminal, the leakage switch, and the control module; the detection unit is electrically connected to the n-th scan terminal, the low voltage terminal, the controllable terminal, the pull-down unit, the leakage switch, and the control module; the pull-down unit, the detection unit, the leakage switch, and the control module are commonly connected to a second node; the first energy storing element is electrically connected between the first node and the low voltage terminal; and the second energy storing element is electrically connected between the second node and the low voltage terminal.

13. The GOA circuit as claimed in claim 12, wherein the relay unit comprises a seventh switch; a control end of the seventh switch is electrically connected to the high voltage terminal; a first end of the seventh switch is electrically connected to the first node; and a second end of the seventh switch is electrically connected to the pull-up unit.

14. The GOA circuit as claimed in claim 12, wherein the pull-up unit comprises an eighth switch; a control end of the eighth switch is electrically connected to the relay unit; a first end of the eighth switch is electrically connected to the n-th clock terminal; and a second end of the eighth switch is electrically connected to the n-th scan terminal.

15. The GOA circuit as claimed in claim 12, wherein the pull-down unit comprises a ninth switch; a control end of the ninth switch is electrically connected to the second node; a first end of the ninth switch is electrically connected to the n-th scan terminal; and a second end of the ninth switch is electrically connected to the low voltage terminal.

16. The GOA circuit as claimed in claim 12, wherein the detection unit comprises a tenth switch, an eleventh switch, and a twelfth switch; a control end of the tenth switch is electrically connected to a first end of the tenth switch and a control end of the eleventh switch; a second end of the tenth switch is electrically connected to the n-th scan terminal; a first end of the eleventh switch is electrically connected to the second node; a second end of the eleventh switch is electrically connected to the low voltage terminal; a control end of the twelfth switch is electrically connected to the controllable terminal; a first end of the twelfth switch is electrically connected to the n-th scan terminal; and a second end of the twelfth switch is electrically connected to the low voltage terminal.

17. A display device, comprising an array substrate and a GOA circuit as claimed in claim 8, wherein the GOA circuit is disposed on the array substrate.

* * * * *